United States Patent
Smayling et al.

(10) Patent No.: US 7,901,953 B2
(45) Date of Patent: Mar. 8, 2011

(54) METHODS AND APPARATUS FOR DETECTING DEFECTS IN INTERCONNECT STRUCTURES

(75) Inventors: Michael C. Smayling, Fremont, CA (US); Shiany Oemardani, San Jose, CA (US); Karl F. Smayling, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 213 days.

(21) Appl. No.: 12/205,871

(22) Filed: Sep. 6, 2008

(65) Prior Publication Data
US 2009/0066358 A1 Mar. 12, 2009

Related U.S. Application Data

(60) Provisional application No. 60/970,292, filed on Sep. 6, 2007.

(51) Int. Cl.
*H01L 21/66* (2006.01)
(52) U.S. Cl. .......................................... 438/14
(58) Field of Classification Search ........................ None
See application file for complete search history.

(56) References Cited

U.S. PATENT DOCUMENTS

| | | | |
|---|---|---|---|
| 6,261,843 B1 | 7/2001 | Chang et al. | |
| 6,858,511 B1 | 2/2005 | Marathe | |
| 6,897,475 B2 | 5/2005 | Wang | |
| 6,943,569 B1 | 9/2005 | Pressley et al. | |
| 7,464,352 B2 * | 12/2008 | Itoh | 716/5 |
| 2003/0082836 A1 * | 5/2003 | Fetterman et al. | 438/14 |
| 2005/0074908 A1 | 4/2005 | Ciplickas et al. | |

* cited by examiner

*Primary Examiner* — Walter L Lindsay, Jr.
*Assistant Examiner* — Andre' C Stevenson
(74) *Attorney, Agent, or Firm* — Dugan & Dugan, PC

(57) ABSTRACT

In some aspects, a method is provided for detecting a void in a test structure that comprises (a) measuring a resistance of the test structure; (b) applying a stress to the test structure at increasing levels until at least one of: (i) the measured resistance of the test structure exceeds a predetermined resistance threshold; and (ii) the stress level reaches a predetermined stress maximum; (c) detecting a void if the measured resistance of the test structure exceeds the predetermined resistance threshold; and (d) determining that the test structure is void free if the stress level reaches the predetermined stress maximum without the measured resistance of the test structure exceeding the predetermined resistance threshold. Numerous other aspects are provided.

14 Claims, 5 Drawing Sheets

US 7,901,953 B2

METHODS AND APPARATUS FOR DETECTING DEFECTS IN INTERCONNECT STRUCTURES

The present application claims priority from U.S. Provisional Application Ser. No. 60/970,292, filed Sep. 6, 2007 and titled "METHODS AND APPARATUS FOR DETECTING DEFECTS IN INTERCONNECT STRUCTURES", which is hereby incorporated by reference herein in its entirety for all purposes.

FIELD OF THE INVENTION

The present invention relates generally to substrate processing, and more specifically to methods and apparatus for detecting a defect or void in an interconnect structure.

BACKGROUND OF THE INVENTION

In the effort to achieve higher circuit densities, features are fabricated on substrates at ever smaller dimensions (e.g., widths) and at correspondingly higher aspect ratios. It has been found that substrate processing at high aspects ratios can lead to certain difficulties such as fabrication defects (e.g., voids). It would be desirable to be able to accurately and efficiently detect defects which may occur on such a small scale.

SUMMARY OF THE INVENTION

In some aspects of the invention, a method is provided for detecting a void in a test structure that comprises (a) measuring a resistance of the test structure; (b) applying a stress to the test structure at increasing levels until at least one of: (i) the measured resistance of the test structure exceeds a predetermined resistance threshold; and (ii) the stress level reaches a predetermined stress maximum; (c) detecting a void if the measured resistance of the test structure exceeds the predetermined resistance threshold; and (d) determining that the test structure is void free if the stress level reaches the predetermined stress maximum without the measured resistance of the test structure exceeding the predetermined resistance threshold.

In other aspects of the invention, a system is provided for detecting a void in a test structure that includes (a) a measurement device adapted to measure a resistance of the test structure; (b) a stressing mechanism adapted to apply a stress to the test structure at increasing levels; and (c) a control unit coupled to the measurement device and the stressing mechanism. The control unit is adapted to (i) determine at least one of whether the measured resistance of the test structure exceeds a predetermined resistance threshold and the stress level has reached a predetermined stress maximum; (ii) detect the presence of a void if the measured resistance of the test structure exceeds the predetermined resistance threshold; and (iii) determine that the test structure is void-free if the stress level applied to the test structure reaches the predetermined stress maximum without the measured resistance of the test structure exceeding the predetermined resistance threshold.

Other features and aspects of the present invention will become more fully apparent from the following detailed description, the appended claims and the accompanying drawings.

DETAILED DESCRIPTION

Interconnect technology is steadily advancing to narrower lines and vias with increased aspect ratios in order to accommodate the push to higher circuit densities and smaller features. The increase in aspect ratio raises challenges for the deposition of metals into damascene trenches and vias without leaving un-filled areas (voids). These process defect voids may result in increased resistivity and may also cause open circuits and device failure. The ability to determine the presence of such voids, missing metal or similar defects (hereinafter 'voids') in interconnect structures would therefore be useful in preventing potential device failure.

Figure 1:
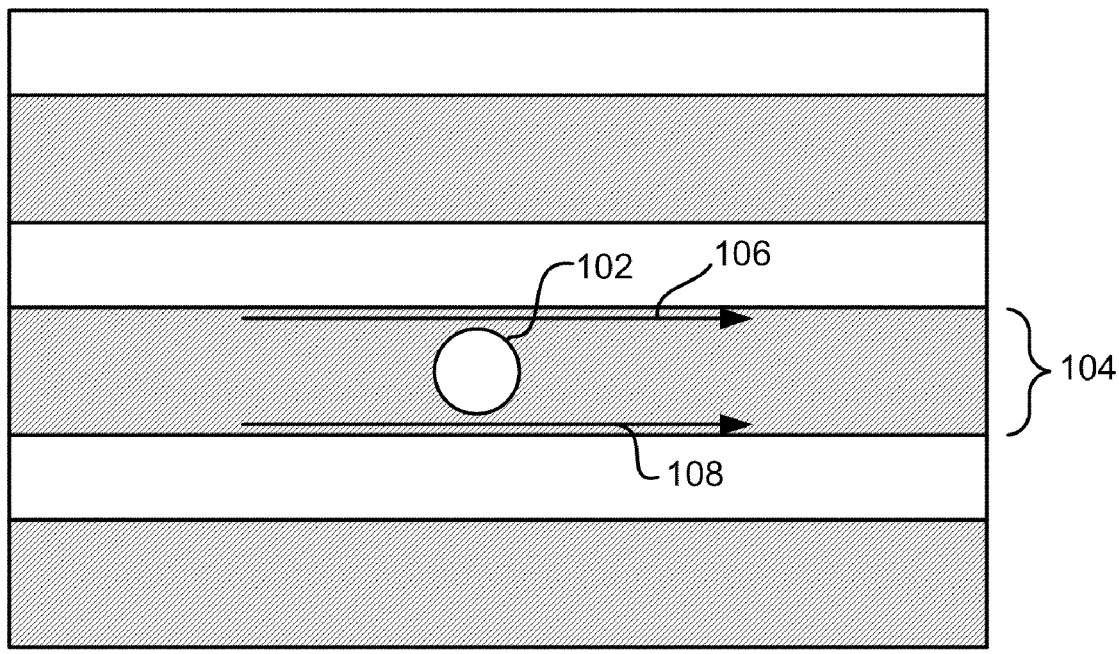
FIG. 1 is a top plan view of an exemplary void in a metal layer of a substrate.

One of the problems with conventional testing methods is that they may not be able to identify the presence of a void in a metal layer that does not completely render to the metal layer unable to convey current. For example, FIG. 1 is a top plan view of an exemplary substrate having void 102 positioned completely within a metal layer 104 (e.g., copper) of the substrate. As shown in FIG. 1, current, as indicated by arrows 106, 108, may still flow within the layer 104 around the void 102. It may be difficult to determine whether such voids are present using conventional testing techniques.

According to embodiments of the present invention, a first test is performed to measure the resistance of a test interconnect structure ('test structure'). If the resistance of the test structure is under a certain threshold, which indicates that the test structure may not include a void (e.g., the test structure passes the first test), a series of stresses (e.g., currents, voltages) of increasing intensity are applied to the structure. These stresses are designed to eventually open any line having a void in either barrier or metal layers, thus revealing the presence of such a void in the test structure. After each stress is applied, a resistance measurement is performed to determine whether the resistance post-stress has increased beyond a threshold indicating that an open circuit has formed.

Figure 2A:
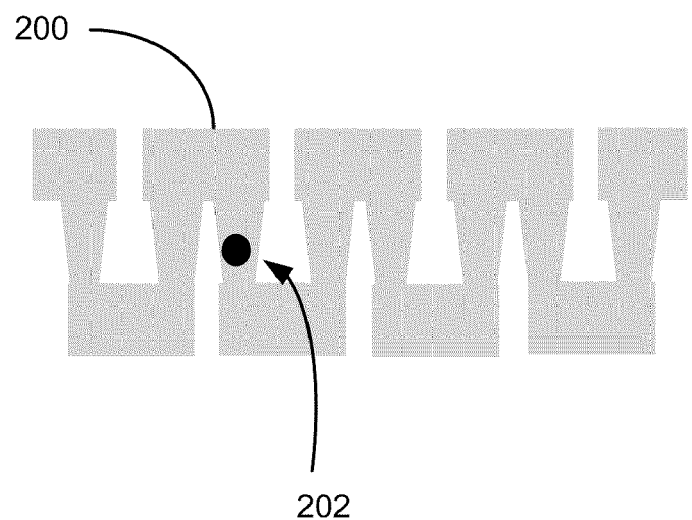
FIG. 2A is a cross-sectional view of an exemplary via chain test structure.

FIG. 2A is a cross-sectional view of an exemplary via chain structure 200 which may be tested according to the present invention. Via chain structures may be used to couple various levels or layers in a substrate to one another. For example, the via chain 200 may connect a plurality of wires on first and second levels of a substrate (not shown). As shown in FIG. 2A, the via chain 200 includes a void 202 which could potentially cause an open circuit and stop current flow along the via chain 200 between multiple levels in a substrate. The via chain 200 may be formed from copper, aluminum or another suitable conducting material.

Figure 2B:
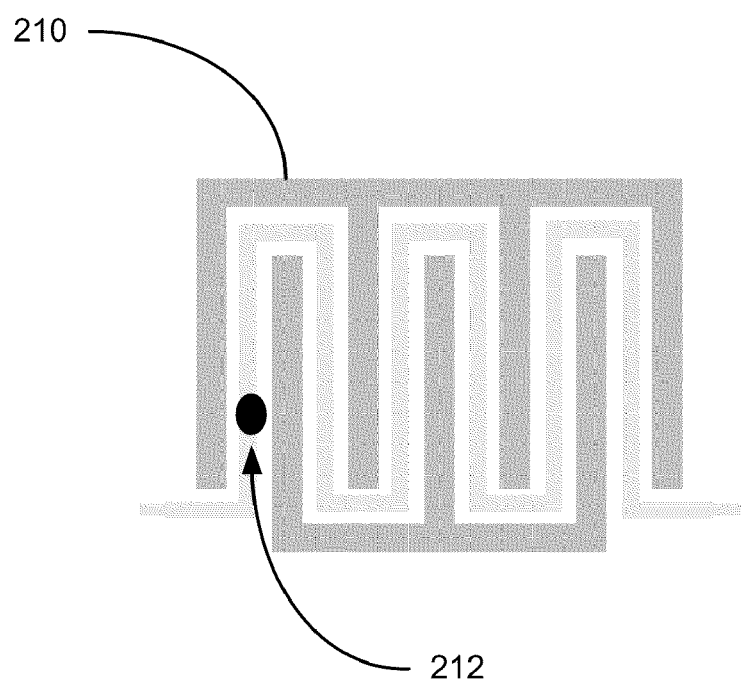
FIG. 2B is a top view of an exemplary comb-serpentine test structure.

FIG. 2B is a top view of an exemplary comb-serpentine wiring structure 210 which may be tested according to the present invention. The comb-serpentine test structure 210 may comprise a pattern of wires (e.g. of copper (Cu) or another suitable conducting material) included within a level or layer of one or more semiconductor devices. As shown in FIG. 2B, the comb-serpentine structure 210 includes a void 212 which could potentially cause an open circuit and stop current flow through wires within a level of one or more semiconductor devices. Other structures may be tested according to the methods of the present invention.

It is noted that the methods of the present invention apply to other interconnect and/or test structures such as Manhattan grid lines, etc.

Figure 3:
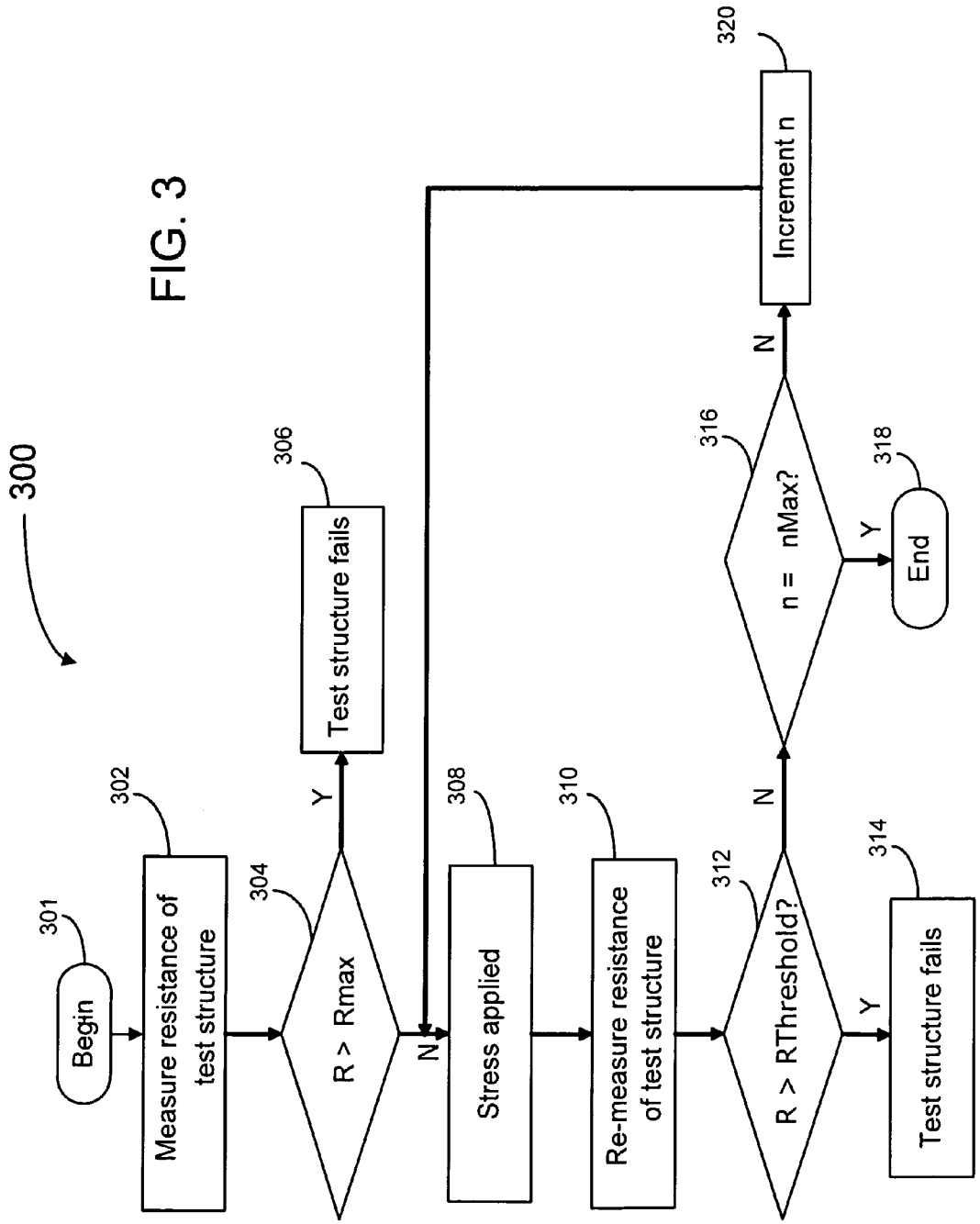
FIG. 3 is a flow chart depicting an exemplary method of detecting a void in a test structure according to an embodiment of the present invention.

FIG. 3 is a flow chart of an exemplary embodiment of a method 300 for detecting a void in a test structure provided according to the present invention. In step 301, the method begins. In step 302, the resistance (R) of a chain, serpent or other test structure is measured using an initial current or voltage. Any suitable resistance measurement may be used such as overall resistance, sheet resistance or resistivity. In step 304, it is determined whether the measured resistance (R) is greater than a certain (predetermined) maximum resistance threshold ($R_{MAX}$), such as $1 \times 10^{33}$ ohms or another suitable value. If $R > R_{MAX}$, it is determined, in step 306, that the test structure has a void that effectively stops current flow, and the structure is considered to have 'failed' the test. However, if in step 304 it is determined that $R <= R_{MAX}$, then, in step 308, a stress is applied to the test structure, for example, in terms of an increase in the magnitude of current or voltage applied to the test structure. In one or more embodiments, the current or voltage may be increased by a factor (n) from the previously applied magnitude, and may be applied to the test structure for a time (m). In the first stress in step 308, the value of n may be two (2). Other values may be used.

In step 310, the resistance (R) of the test structure is re-measured. In step 312, it is determined whether the resistance post-stress is greater than a predetermined threshold value ($R_{TH}$), such as $1 \times 10^{43}$ ohms or another suitable value. If $R > R_{TH}$, it is determined, in step 314, that the test structure has a void and the test structure is considered to have 'failed' the test. However, if in step 312 it is determined that $R <= R_{TH}$, then, in step 316, it is determined whether the factor (n) by which the stress level is increased has reached a predetermined maximum value ($n_{MAX}$). If it is determined that $n = n_{MAX}$, then in step 318 the method ends. If, however, it is determined that $n < n_{MAX}$, then in step 320, n is increased (e.g., incremented) by a preset amount. In one or more embodiments, n may be incremented by a whole number value such as one (1). The factor n may be increased by other and/or non-whole number amounts. The method 300 then cycles back to step 308 for a further application of increased stress to the test structure. In this manner, the test continues until either the test structure fails or the test structure passes the test at a highest prescribed stress level (i.e., at $n = n_{MAX}$).

The highest prescribed stress level (at $n = n_{MAX}$) is set so as to distinguish a test structure that includes a void from void-free test structures by stressing the test structure at a level that should open any voids to create an open circuit, while not affecting void-free test structures.

In one exemplary embodiment, a current of about 0.1 mA may be used to measure the initial resistance of the test structure (step 302). For the first stress (step 308), the current may be increased to about 1 mA for about 1 minute. For the second stress, the current may be increased to about 5 mA for about 1 minute. For the third stress, the current may be increased to about 10 mA for about 1 minute, etc. Other stress amounts and/or times may be used.

Figure 4:
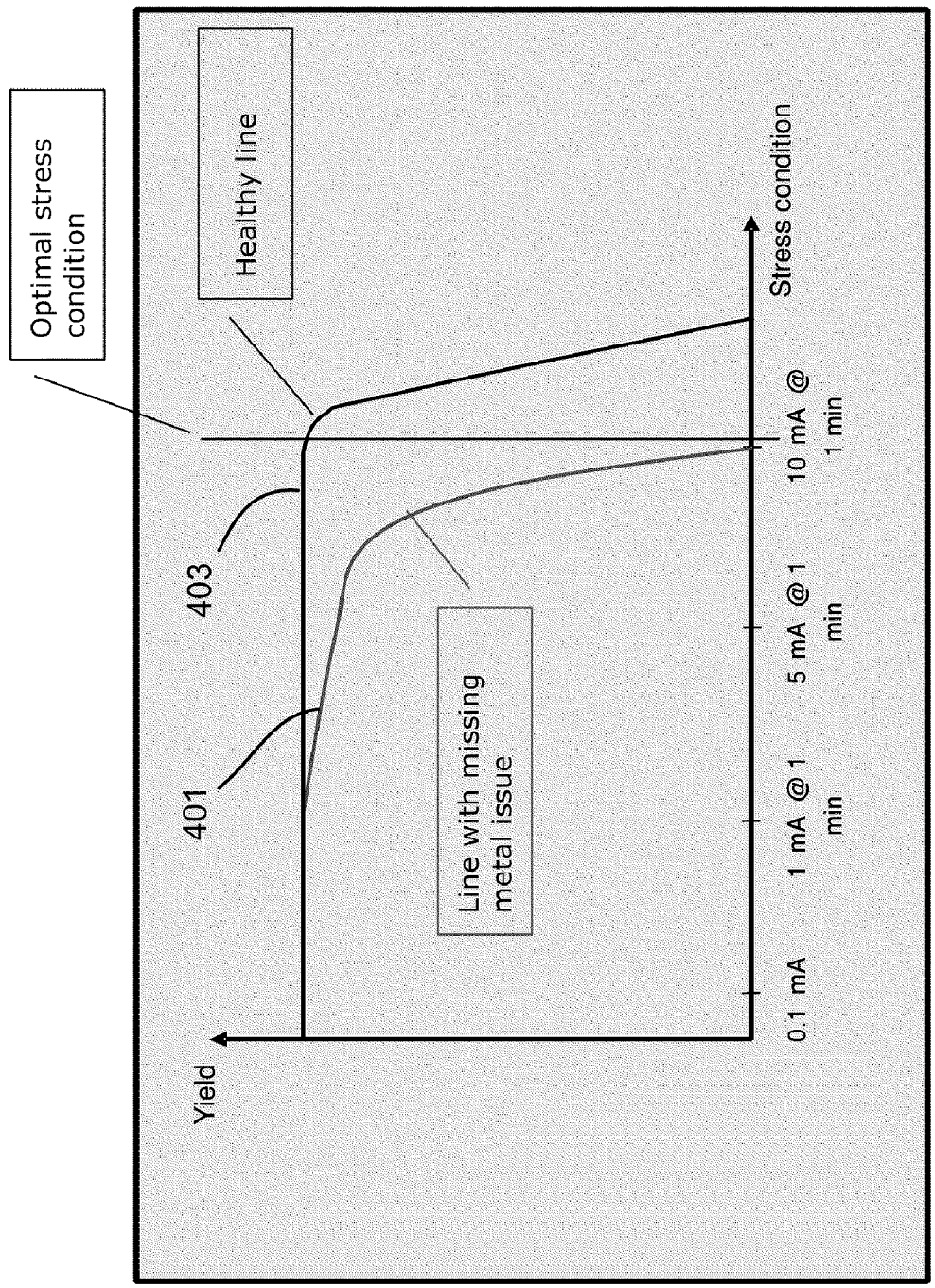
FIG. 4 is a graph showing predicted responses of void-containing and void-free test structures to applied stressing in accordance with the present invention.

FIG. 4 is a graph showing predicted responses of void-containing (curve 401) and void-free (curve 403) test structures to increasing stress conditions. As shown, there is an optimal stress condition (or range of conditions) measured in current transmitted over time, at which the yield of a test structure having a void will fall to about zero while the yield of a corresponding test structure without a void will be unaffected by the applied stressing levels.

Figure 5:
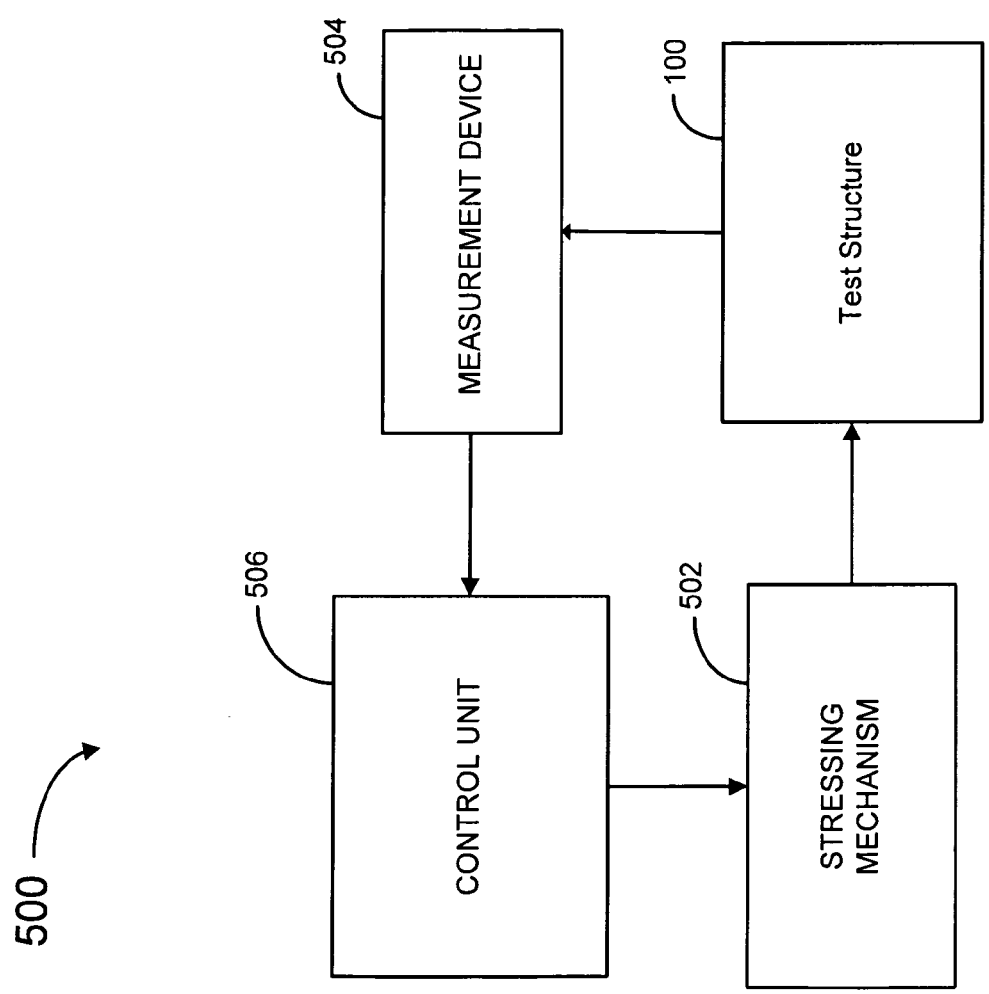
FIG. 5 is a block diagram of an exemplary system for detecting a void in a test structure according to an embodiment of the present invention.

FIG. 5 is a schematic block diagram of an exemplary system 500 for detecting a void in a test structure according to an embodiment of the present invention. The system 500 includes a stressing mechanism 502 adapted to apply a stress to a test structure 100. The stressing mechanism 502 may comprise, for example, an electronic circuit adapted to deliver a controllable amount of current to the test structure over a controllable period of time. The response of the test structure may be measured by a measurement device 504, which may comprise, for example, a device for determining the electrical resistance (or resistivity) of the test structure such as an ohm-meter. A control unit 506 is coupled to and receives measurement signals from the measurement device 504 and is also coupled to the stressing mechanism 502. The control unit 506 may include one or more appropriately programmed microprocessors or microcontrollers, memory devices, dedicated hardware, and/or a combination of the same. In one or more embodiments, the stressing mechanism 502 and/or the measurement device 504 may be incorporated within the control unit 506 as one or more sub-components.

The control unit 506 may be programmed to control the level of stress provided by the stressing mechanism 502. In particular, the control unit 506 may control operation of the stressing mechanism 502 to increment or otherwise increase the stress levels according to the methods discussed above to detect whether the test structure includes one or more voids. The control unit 506 may be programmed to set relevant parameters including: the initial resistance threshold (Rmax), the additional resistance threshold (Rth), the stress level maximum (nMax), the initial factor by which the stress is increased (n), the amount by which the stress level is increased in subsequent iterations, the period of time (m) a stress condition is applied and the like.

The foregoing description discloses only exemplary embodiments of the invention. Modifications of the above disclosed apparatus and methods which fall within the scope of the invention will be readily apparent to those of ordinary skill in the art. For example, in one or more embodiments, certain indicative changes in resistance and/or resistivity other than an increase in resistance beyond a threshold (Rth) may be used to detect the presence of a void. Such indicative changes may be a large increase in resistance arising from an incremental change in stress ((dR/dS)>threshold)).

Accordingly, while the present invention has been disclosed in connection with exemplary embodiments thereof, it should be understood that other embodiments may fall within the spirit and scope of the invention, as defined by the following claims.

The invention claimed is:

1. A method of detecting a void in a test structure comprising:
   a) measuring a resistance of the test structure;
   b) applying a stress to the test structure at increasing levels until at least one of:
      i) the measured resistance of the test structure exceeds a predetermined resistance threshold; and
      ii) the stress level reaches a predetermined stress maximum;
   c) detecting a void if the measured resistance of the test structure exceeds the predetermined resistance threshold; and
   d) determining that the test structure is void free if the stress level reaches the predetermined stress maximum without the measured resistance of the test structure exceeding the predetermined resistance threshold.

2. The method of claim 1, wherein a measurement of the resistance of the test structure is performed after each increase in the stress level.

3. The method of claim 1, wherein the test structure comprises a chain structure or a serpentine structure.

4. The method of claim 1 wherein the stress level comprises a current level.

5. The method of claim 1 wherein each stress level is applied to the test structure for a predetermined time period.

6. The method of claim 1 wherein the void is formed in a barrier layer of the test structure.

7. The method of claim 1 wherein the void is formed in a metal layer of the test structure.

8. A system for detecting a void in a test structure comprising:
 a measurement device adapted to measure a resistance of the test structure;
 a stressing mechanism adapted to apply a stress to the test structure at increasing levels; and
 a control unit coupled to the measurement device and the stressing mechanism, the control unit adapted to:
  i) determine at least one of whether the measured resistance of the test structure exceeds a predetermined resistance threshold and the stress level has reached a predetermined stress maximum;
  ii) detect the presence of a void if the measured resistance of the test structure exceeds the predetermined resistance threshold; and
  iii) determine that the test structure is void-free if the stress level applied to the test structure reaches the predetermined stress maximum without the measured resistance of the test structure exceeding the predetermined resistance threshold.

9. The system of claim 8, wherein the control unit is adapted to cause the measurement device to perform a measurement of the resistance of the test structure after each increase in the stress level.

10. The system of claim 8 wherein the test structure comprises a chain structure or a serpentine structure.

11. The system of claim 8 wherein the stress level comprises a current level.

12. The system of claim 8 wherein the stressing mechanism is adapted to apply each stress level to the test structure for a predetermined time period.

13. The system of claim 8 wherein the void is formed in a barrier layer of the test structure.

14. The system of claim 8 wherein the void is formed in a metal layer of the test structure.

* * * * *